(12) United States Patent
Kraemer et al.

(10) Patent No.: US 7,525,100 B2
(45) Date of Patent: Apr. 28, 2009

(54) BRIGHT AND FAST NEUTRON SCINTILLATORS

(75) Inventors: Karl Wilhelm Kraemer, Berne (CH); Hans-Ulrich Guedel, Thorishaus (CH); Aurelie Bessiere, Paris (FR); Pieter Dorenbos, Rijswijk (NL); Carel Wilhelm Eduard Van Eijk, Delft (NL)

(73) Assignees: Stichting Voor de Technische Wetenschappen, JP Utrecht (NL); Universite de Berne, Berne (CH)

( * ) Notice: Subject to any disclaimer, the term of this patent is extended or adjusted under 35 U.S.C. 154(b) by 48 days.

(21) Appl. No.: 10/585,649

(22) PCT Filed: Jan. 10, 2005

(86) PCT No.: PCT/EP2005/000098

§ 371 (c)(1),
(2), (4) Date: Jul. 7, 2006

(87) PCT Pub. No.: WO2005/068585

PCT Pub. Date: Jul. 28, 2005

(65) Prior Publication Data

US 2007/0295915 A1     Dec. 27, 2007

(30) Foreign Application Priority Data

Jan. 9, 2004     (EP)     ................... 04290068

(51) Int. Cl.
*G01T 3/00* (2006.01)
(52) U.S. Cl. ............................... 250/390.11
(58) Field of Classification Search ............ 250/390.11
See application file for complete search history.

(56) References Cited

U.S. PATENT DOCUMENTS 4,761,347 A     8/1988     Nakamura

FOREIGN PATENT DOCUMENTS

EP     0 685 548     12/1995

OTHER PUBLICATIONS

E V D van Loef et al., "Scintillation and Spectroscopy of the Pure and CE3+-Doped Elpasolites: CS2LIYX6 (X=CI, BR)", Journal of Physics: Condensed Matter, vol. 14, pp. 8481-8496, Sep. 19, 2002.
Alexander N. Mishin et al., "Search for New Scintillators for X- and Y-Ray Detectors", Proceedings of SPIE, vol. 4348, pp. 47-51, 2001.
P.A. Rodnyi, "Progress in Fast Scintallators", Radiation Measurements, vol. 33, No. 5, pp. 605-614, 2001.

*Primary Examiner*—Constantine Hannaher
(74) *Attorney, Agent, or Firm*—Oblon, Spivak, McClelland, Maier & Neustadt, P.C.

(57) ABSTRACT

A scintillating material of the generic formula $Cs_{(2-z)}Rb_z LiLn_{(1-x)}X_6:xCe^{3+}$, where X is either Br or I, Ln is Y or Gd or Lu or Sc or La, where z is greater or equal to 0 and less or equal to 2, and x is above 0.0005 useful for detecting neutrons in a sample of radiation.

20 Claims, No Drawings

BRIGHT AND FAST NEUTRON SCINTILLATORS

The invention pertains to new scintillating materials, in particular in the form of single crystals, a process to manufacture them as single crystals, and their use for to detect and/or discriminate neutron and/or gamma ray radiations.

Scintillation materials are largely used for detection of gamma-rays (or electromagnetic waves of lower energies down to 1 keV or lower, below designated as "gammas") as well as particles like neutrons, alpha particles etc.

The scintillation mechanisms rely on a number of physical principles which essentially convert the high energy of the incoming photons or particles into light which is within or reasonably close to the visible range. Of particular interest are single crystal forms of scintillators, i.e., pieces that are at the scale of use constituted of one (at most a few) crystals. A single crystal (monocrystal) configuration allows easier extraction of the emitted light over thick dimensions thanks to lack of internal diffusion through grain boundaries, heterogeneities and other defects that tend to be present in polycrystalline materials. A crystalline structure (in the atomic sense) is required as it determines the scintillation mechanisms: a glassy, amorphous state of matter is likely to yield different scintillation properties. The extracted light is then collected with various devices well known to the man of the art, like photomultiplier tubes, photodiodes etc. Another configuration is to still retain the crystalline structure of the material, and use it in powder form, either packed or sintered or mixed with a binder in a way that still allows light extraction. Usually, those configurations are too opaque when more than a few millimeters thick, a thickness which may not be sufficient to stop enough incoming particles or photons. Overall, whenever possible and cost effective, single crystals are preferred.

Gammas, alpha or beta particles, charged particles, or neutrons (below designated generically as "radiation") detection (is of major interest in a host of applications in nuclear medicine, fundamental physics, industrial gauging, baggage scanners, oil well logging etc. In those applications, it is often desirable to discriminate neutrons from gamma rays that may also reach the detector and a scintillation detector should be able to produce different luminescence signals depending on the type of radiation (see G. F. Knoll, Radiation Detection and Measurements (Wiley, New York, 2000)).

Several criteria are needed to constitute a good neutron or gamma detector.

In a way well-known to the man in the field, an energy spectrum of the scintillator under incoming radiation is drawn, whereby events are represented on a histogram (with energies on the x-axis, the number of counts on the y-axis). In the acquisition protocol, "channels" are defined to collect the signal within a particular energy range.

Good (low) energy resolution is necessary for good energy peak identification of the incoming radiation. Energy resolution is usually determined for a given detector at a given energy as the full width at half maximum of the peak considered on an energy spectrum, divided by the energy at the centroid of the peak (see G. F Knoll, "Radiation Detection and Measurement", John Wiley and Sons, Inc, $2^{nd}$ édition, p 114).

Another very important parameter is the decay time constant, which is described in particular by W. W Moses (Nucl. Instr and Meth. A336 (1993) 253). Fast decay times allow fast analyses. In general, the time spectrum of the collected signal from a scintillator under radiation (neutrons or gammas) can be fitted by a sum of exponentials characterized each by a decay time constant. The quality of a scintillator is determined essentially by the contribution of the fastest emission component. This is the number we report further in the text.

Neutron detection is often carried out with He3 tubes. This type of device has high detection efficiency, good neutron/gamma discrimination, can be made into a wide range of detector sizes, and has a long history in the field. Its weaknesses are a relatively long charge collection time and low signal levels. In a lot of cases, solid-state scintillators are preferred.

A number of scintillators used for neutron detection rely on the presence of $^6$Li in the molecule. $^6$Li is able to capture thermal neutrons and convert them into ionizing particles according to the reaction:

$$^6_3Li + ^1_0 n \rightarrow ^3_1 H + \alpha \tag{1}$$

The $\alpha$ and triton particles share a kinetic energy of 4.78 MeV. The subsequent deposition of this energy in the material can lead to detectable luminescence. However the mere presence of $^6$Li does not guarantee good properties.

It is thus convenient to define a gamma/neutron discrimination indicator, the so-called $\gamma$-equivalent factor $F_\gamma$ defined as:

$$F_\gamma = \frac{C_n}{C_\gamma} \cdot \frac{0.662}{4.78} \tag{2}$$

where $C_n$ is the channel of the neutron peak (in the acquisition protocol) and $C_\gamma$ the channel of the $\gamma$ peak while 0.662 MeV is the energy of the $\gamma$-rays and 4.78 MeV the kinetic energy of the $\alpha$ and triton particles together (resulting from neutron capture).

For radiography, LiF+ZnS(Ag) screens are quite standard. The high light output (160 000 photons/neutron) is very attractive and allows good sensitivity. Its decay time is in the microsecond range.

Li glass, especially the kind enriched in $^6$Li, is another prominent neutron detector. Its light output is unfortunately very low at 6000 photons/neutron and its energy resolution high. It has the advantage of fast decay, with a decay constant at about 75 ns.

$^6$LiI (lithium iodide) doped with Europium (Eu) is also a known neutron detector. The light output at about 51 000 photons/neutron is very good. The energy resolution is nonetheless extremely high, the decay constant as high as that of LiF+ZnS(Ag).

Of late, new compounds have been discovered by Bessiere et al (Scint 2003, to be published in proceedings), namely $Cs_2LiYCl_6$ and $Cs_2LiYCl_6:Ce^{3+}$. Both exhibit high light output (34 000 and 70 000 respectively). Their $\gamma$-equivalent factor is also very good at 0.61 and 0.66 respectively. All results on the Ce-doped version are given for a concentration of 0.1 mol %. Nonetheless, those two compounds have slow decay times (about 6-7 microseconds).

In addition, $Cs_2LiYBr_6$ and $Cs_2LiYBr_6:Ce$ are mentioned in "Scintillation and Spectroscopy of the Pure and $Ce^{3+}$-Doped Elpasolithes", Van Loef et al., Journal of Physics Condensed Matter, 14, 2002, 8481-8496. The optical and scintillation (under gamma-rays) properties of these compounds are investigated. There is however no reference to their scintillation characteristics under neutrons. Only the fact that Li presence may make such bromine-based compounds attractive is mentioned. This does not guarantee good performance under neutrons.

Present invention pertains to a new material showing a remarkably high light yield and a fast (i.e. low) decay time to neutrons (which can be designated by τ). The material also preserves good detection properties for gamma-rays and allows good discrimination between gamma-rays and neutrons.

The material of the invention has as generic formula $Cs_{(2-z)}Rb_zLiLn_{(1-x)}X_6:xCe^{3+}$, where X is either Br or I, Ln is Y or Gd or Lu or Sc or La, where z is greater or equal to 0 and less or equal to 2, and x is above 0.0005. The value x is the molar fraction of the sum of Ln and Ce. The value x is above 0.0005, but it can also be said that x is above 0.05 mol %. Both wordings are equivalent. Generally, x is less than 0.3 (=less than 30 mol %) and more generally less than 0.15.

Particularly useful compositions are:
$Cs_2LiY_{(1-x)}X_6:xCe^{3+}$,
$CsRbLiY_{(1-x)}X_6:xCe^{3+}$.

The scintillating material of the invention can be manufactured under the form of a monocrystal. In this case, its volume is generally at least 10 mm³. The material can also be used in the form of a powder (polycrystalline), possibly either packed or sintered or mixed with a binder.

The compounds were grown as single crystals by the vertical Bridgman technique. Because the compounds are hygroscopic the experiments were performed on samples sealed in quartz ampoules. Other known techniques to the man in the field of crystal growths could be used such as Czochralski or Kyropoulos techniques, provided the material is reasonably protected from reaction with water and oxygen. The single crystal samples in the examples were about 10 mm³ in volume. They contain a natural abundance of $^6Li$, but they could be advantageously enriched in it (to the detriment of cost).

The properties of $Cs_2LiYBr_6:Ce^{3+}$ are given in Table 1 below, along with those of the scintillators already known in the field of neutron detection.

TABLE 1

Comparative properties of $Cs_2LiYBr_6:Ce^{3+}$ and other neutron scintillators.

| Compound | Light Yield (photons/neutron) | Energy resolution to neutrons (%) | Pulse Height Discrimination $F_\gamma$ | Decay Time (μs) Under gammas/neutrons |
|---|---|---|---|---|
| 1 $Cs_2LiYCl_6$ | 34000 | 14.5 | 0.61 | 7.0 |
| 2 $Cs_2LiYCl_6$:0.1% Ce | 70000 | 5.5 | 0.66 | 6.5 |
| 3 $Cs_2LiYBr_6$:1% Ce | 85800/88200 | 4.5/9.0* | 0.76/0.75 | 0.089 |
| 4 $Cs_2LiYBr_6$:0.3% Ce | 73 000 | — | — | 0.070/0.0083 |
| 5 $Rb_2LiYBr_6$:0.5% Ce | 65 000 | — | — | — |
| 6 LiF—ZnS:Ag | 160 000 | — | 0.45 | 1 |
| 7 LiI:Eu | 51 000 | 40 | 0.86 | 1.2 |
| 8 Li glass | 6 000 | 13-22 | 0.31 | 0.075 |

(*Double-peak structure in spectrum for sample)
(0.1% Ce significates x = 0.001 in the generic formula which is in fact $Cs_2LiY_{0.999}Ce_{0.001}X_6$.)

It appears from Table 1 that the samples according to the invention (samples 3, 4, 5) have excellent light yields to neutrons, fast decay times and good gamma-neutron discrimination as seen from the $F_\gamma$ factor. The emission wavelength has a double peak structure at 390 and 420 nm approximately, which conveniently matches the maximum sensitivity of bi-alkali photomultiplier tubes. The products according to the invention have the advantage over $Cs_2LiYCl_6$:0.1% Ce (as in sample 2) to be extremely fast scintillators, and to have even higher light outputs and $F_\gamma$ factors. These features are not described in the Van Loef et al., reference mentioned above.

Table 1 also shows that $Rb_2LiYBr_6$:Ce according to the invention (with a complete substitution of Cs by Rb) is equally interesting. Finally, although not described here, substitution of Y by other rare earths or assimilated rare earths in the same column in the periodic table like Sc, La, Lu is also part of the invention.

The following Table 2 summarizes in more detail the properties of the compounds of the invention in the cases of gammas (as emitted by a $^{137}Cs$ source), neutrons alone or combined gammas+neutrons detection. The first two decay constants (the fastest, then second fastest) in the exponential series decomposition are reported.

TABLE 2

Main characteristics of $Cs_2LiYBr_6:Ce^{3+}$ under gamma, neutron and gamma + neutrons radiations ($R_n$ = energy resolution for neutron)

| | $^{137}Cs$ γ-rays | | Thermal neutrons | | | $^{137}Cs$ γ + neutrons |
|---|---|---|---|---|---|---|
| Compound | LY (ph/MeV) | R (%) | LY (ph/n) | $F_\gamma$ | $R_n$ (%) | τ (μs) |
| $Cs_2LiYCl_6$ | 11 700 | 12.0 | 34 000 | 0.61 | 14.5 | 0.004/7.0 |
| $Cs_2LiYCl_6$:0.1% Ce | 21 600 | 8.0 | 70 000 | 0.66 | 5.5 | 0.004/non exp. |
| $Cs_2LiYBr_6$:1% Ce | 23 600 | 7.0 | 85 800 | 0.76 | 4.5 | 0.089/2.5 |
| | 24 700 | 8.5 | 88 200 | 0.75 | 9.0 | id. |

It is shown in particular that materials of the invention constitute an interesting gamma detectors, less bright than the NaI:Tl known in the field of gamma detection, equivalent Energy resolution but much faster decay.

The invention claimed is:

1. A neutron detector comprising
scintillating material $Cs_{(2-z)}Rb_zLiLn_{(1-x)}X_6:xCe^{3+}$, where X is either Br or I, Ln is Y or Gd or Lu or Sc or La, where z is greater or equal to 0 and less or equal to 2, and x is above 0.0005; and a detector which detects luminescence emitted from the scintillating material as a a measure of the presence of neutrons in a radiation sample applied to the neutron detector.

2. The neutron detector according to claim 1, wherein x is above 0.005.

3. The neutron detector according to claim 1, wherein x is less than 0.3.

4. The neutron detector according to claim 1, wherein x is less than 0.15.

5. The neutron detector according to claim 1, wherein it is in the form of a monocrystal.

6. The neutron detector according to claim 5, wherein the volume of the monocrystal is at least 10 mm$^3$.

7. The neutron detector according to claim 1, wherein the scintillating material is in the form of a powder.

8. The neutron detector according to claim 1, wherein the scintillatiing material is packed, sintered, or mixed with a binder.

9. The neutron detector according to claim 1, wherein the scintillating material formula is $Cs_2LiYX_6:xCe^{3+}$.

10. The neutron detector according to claim 1, wherein the scintillating material formula is $Rb_2LiYX_6:xCe^{3+}$.

11. A method of neutron detection comprising
applying radiation to a detector comprising a material of formula $Cs_{(2-z)}Rb_zLiLn_{(1-x)}X_6:xCe^{3+}$, where X is either Br or I, Ln is Y or Gd or Lu or Sc or La, where z is greater or equal to 0 and less or equal to 2, and x is above 0.0005; and
measuring luminescence from the detector as a measure of the presence of neutrons in the radiation.

12. The method according to claim 11, wherein x is above 0.005.

13. The method according to claim 11, wherein x is less than 0.3.

14. The method according to claim 13, wherein x is less than 0.15.

15. The method according to claim 11, wherein the material is in the form of a monocrystal.

16. The method according to claim 15, wherein the volume of the monocrystal is at least 10 mm$^3$.

17. The method according to claim 11, wherein the material is in the form of a powder.

18. The method according to claim 17, wherein the material is packed, sintered, or mixed with a binder.

19. The method according to claim 11, wherein the material formula is $Cs_2LiYX_6:xCe^{3+}$.

20. The method according to claim 11, wherein the material formula is $Rb_2LiYX_6:xCe^{3+}$.

* * * * *